US012635216B2

(12) United States Patent
Anderson et al.

(10) Patent No.: US 12,635,216 B2
(45) Date of Patent: May 19, 2026

(54) VERTICAL TRANSISTOR WITH SELF-ALIGN BACKSIDE CONTACT

(71) Applicant: INTERNATIONAL BUSINESS MACHINES CORPORATION, Armonk, NY (US)

(72) Inventors: Brent A. Anderson, Jericho, VT (US); Su Chen Fan, Cohoes, NY (US); Jay William Strane, Warwick, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 832 days.

(21) Appl. No.: 17/823,969

(22) Filed: Sep. 1, 2022

(65) Prior Publication Data

US 2024/0079461 A1 Mar. 7, 2024

(51) Int. Cl.
| | |
|---|---|
| *H10D 30/63* | (2025.01) |
| *H10D 30/01* | (2025.01) |
| *H10D 64/01* | (2025.01) |
| *H10D 64/23* | (2025.01) |

(52) U.S. Cl.
CPC ....... *H10D 64/252* (2025.01); *H10D 30/0215* (2025.01); *H10D 30/025* (2025.01); *H10D 30/63* (2025.01); *H10D 64/01* (2025.01)

(58) Field of Classification Search
CPC .... H10D 30/025; H10D 30/63; H10D 30/635; H10D 30/6728; H10D 62/122; H10D 64/252; H10D 64/2523; H10D 64/2527; H10D 84/016
See application file for complete search history.

(56) References Cited

U.S. PATENT DOCUMENTS

| | | | |
|---|---|---|---|
| 9,356,043 B1 | 5/2016 | Sakakibara | |
| 9,595,535 B1 | 3/2017 | Ogawa | |
| 9,768,218 B2 | 9/2017 | Huang | |
| 9,799,655 B1 * | 10/2017 | Cheng ................ | H10D 30/6728 |
| 9,812,461 B2 | 11/2017 | Doda | |
| 10,079,230 B2 | 9/2018 | Stuber | |
| 10,147,648 B1 | 12/2018 | Zang | |
| 10,242,994 B2 | 3/2019 | Inomata | |
| 10,797,139 B2 | 10/2020 | Morrow | |
| 2009/0152611 A1 * | 6/2009 | Fujimoto ............ | H01L 21/6835 |
| | | | 438/269 |

(Continued)

FOREIGN PATENT DOCUMENTS

| | | |
|---|---|---|
| CN | 119817190 A | 4/2025 |
| WO | 2018093441 A1 | 5/2018 |
| WO | 2024/046738 A1 | 3/2024 |

OTHER PUBLICATIONS

Huang et al., "Top-Gate Amorphous Silicon TFT With Self-Aligned Silicide Source/Drain and High Mobility", IEEE Electron Device Letters, vol. 29, No. 7, Jul. 2008, pp. 737-739.

(Continued)

*Primary Examiner* — Eric A. Ward
(74) *Attorney, Agent, or Firm* — L. Jeffrey Kelly

(57) ABSTRACT

A semiconductor structure including a fin of a vertical transistor structure, a top source drain region on a top side of the fin, a bottom source drain region on a bottom side of the fin, and a backside contact below and contacting the bottom source drain region.

23 Claims, 15 Drawing Sheets

SECTION Y-Y

(56) References Cited

U.S. PATENT DOCUMENTS

| | | | |
|---|---|---|---|
| 2017/0294377 A1 | 10/2017 | Dunga | |
| 2017/0309630 A1 | 10/2017 | Cheng | |
| 2018/0190670 A1 | 7/2018 | Ryckaert | |
| 2018/0315850 A1 | 11/2018 | Liu | |
| 2020/0381300 A1* | 12/2020 | Zhang | H10D 86/01 |
| 2020/0411315 A1 | 12/2020 | Huang | |
| 2021/0028174 A1* | 1/2021 | Lee | H01L 21/76877 |
| 2021/0296178 A1 | 9/2021 | Xie | |
| 2021/0305428 A1* | 9/2021 | Ju | H01L 21/76897 |
| 2021/0327766 A1 | 10/2021 | Wang | |
| 2021/0336012 A1* | 10/2021 | Huang | H10D 64/01 |
| 2021/0376093 A1 | 12/2021 | Chu | |
| 2021/0399099 A1 | 12/2021 | Chu | |

OTHER PUBLICATIONS

Notification of Transmittal of the International Search Report and the Written Opinion of the International Searching Authority, or the Declaration, Date of mailing Oct. 27, 2023, International application No. PCT/EP2023/072255, 11 pages.

* cited by examiner

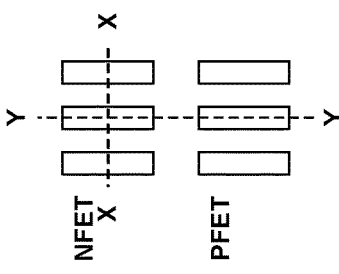
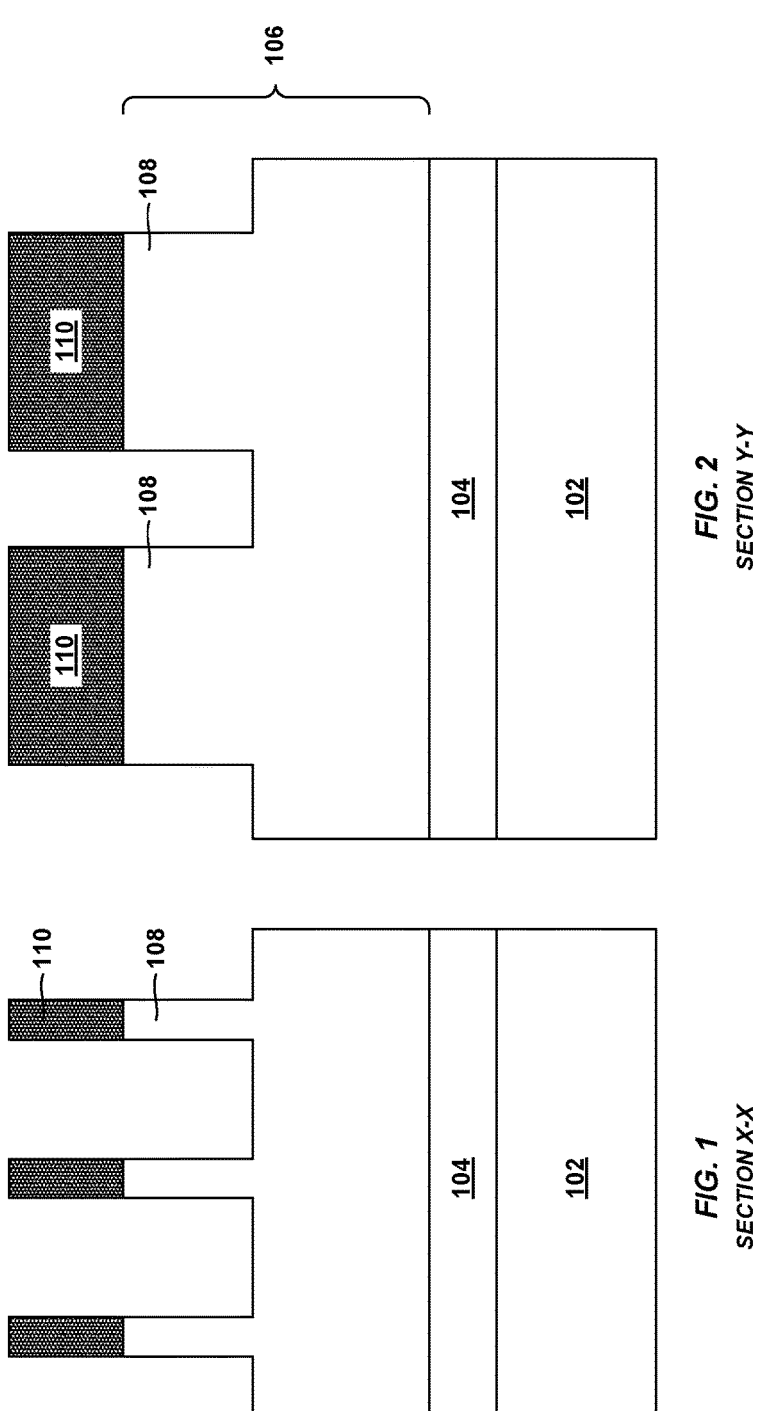
FIG. 2
SECTION Y-Y
FIG. 1
SECTION X-X
100

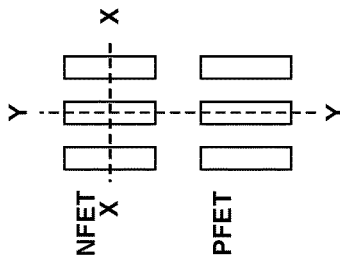
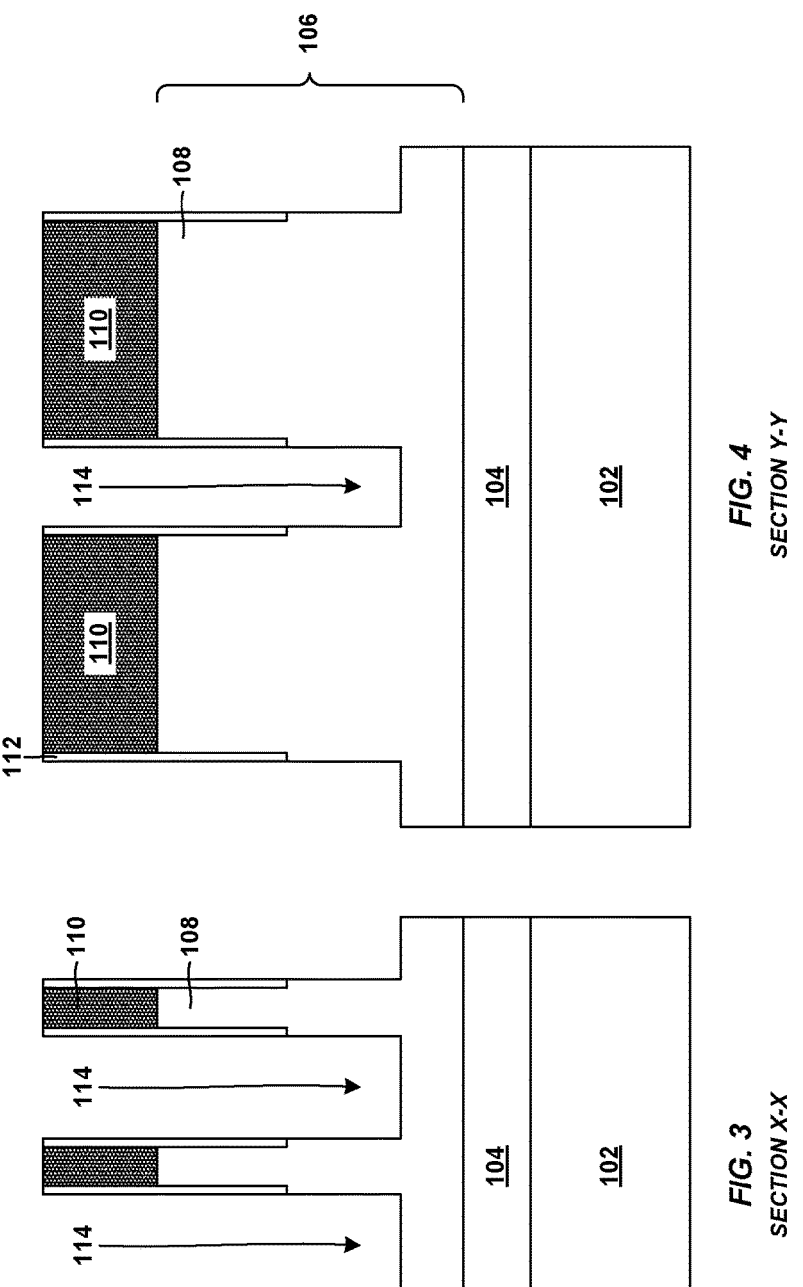
FIG. 4
SECTION Y-Y
FIG. 3
SECTION X-X

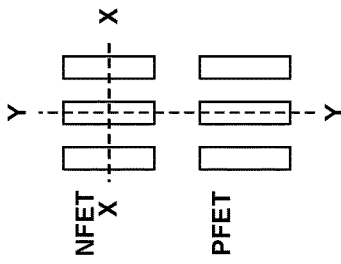
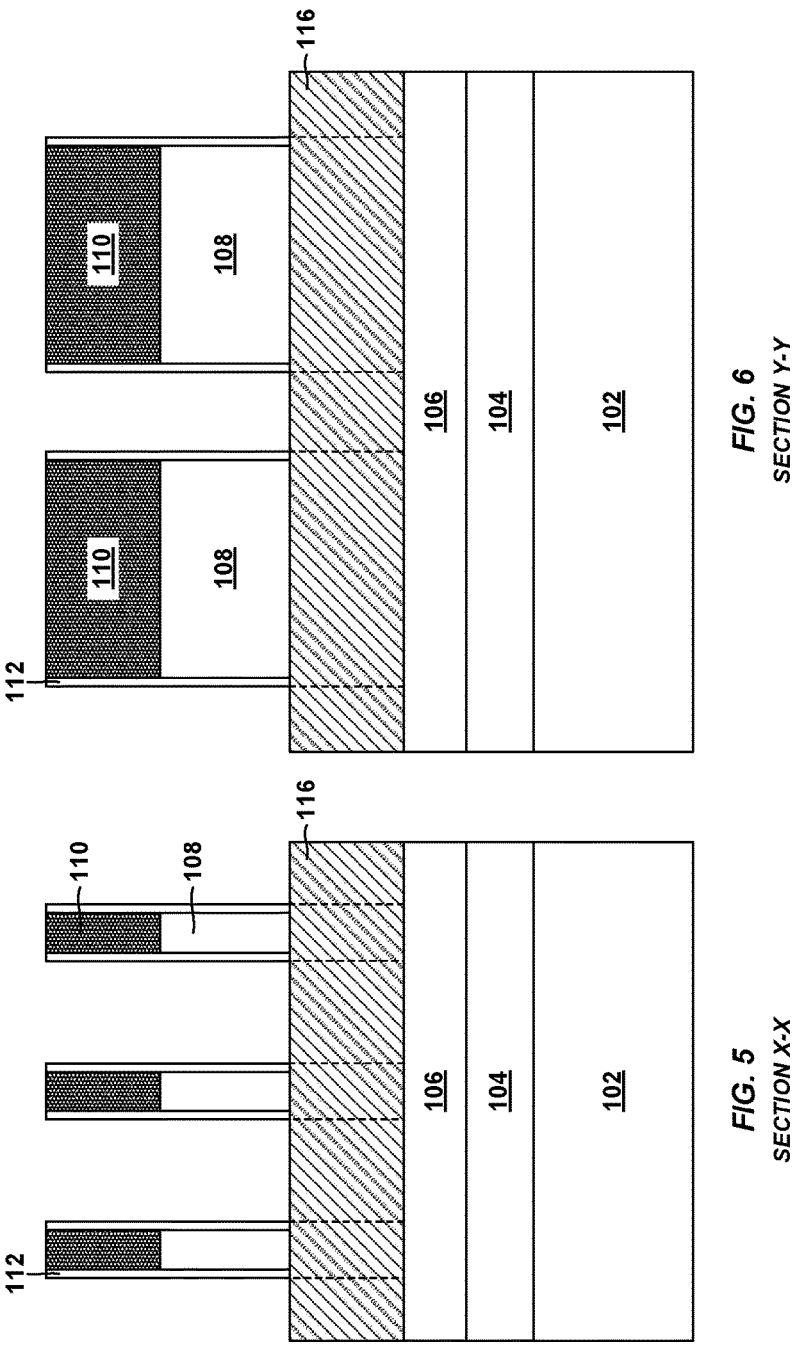
FIG. 6
SECTION Y-Y
FIG. 5
SECTION X-X

100

110
108
116
106
104

112

110
108
116
106

SECTION X-X

102

112

110
108
116
106

110
108
116
106

104

SECTION Y-Y

102

NFET

PFET

X

Y

Y

X

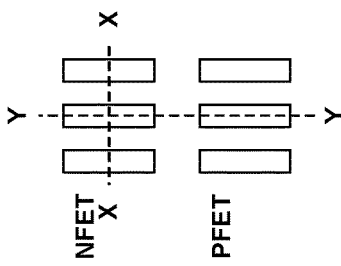
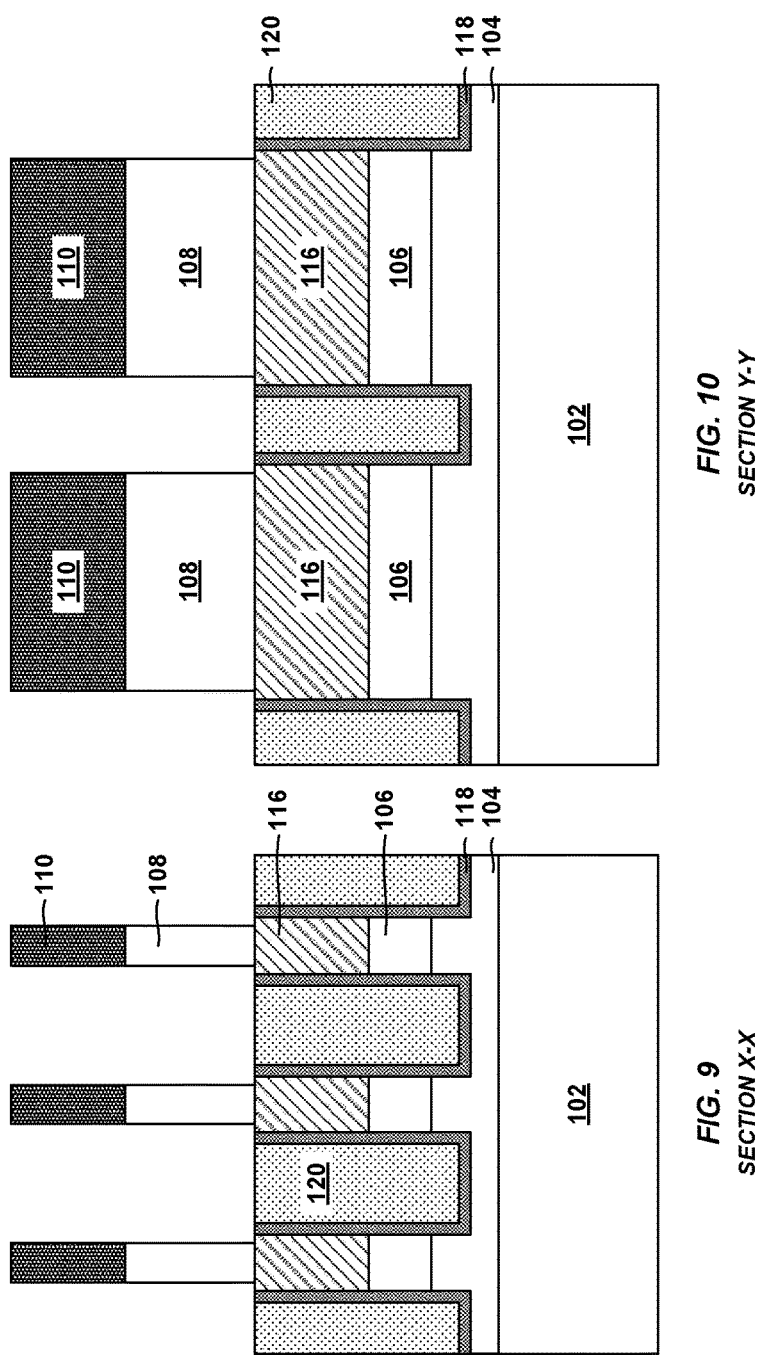
FIG. 10
SECTION Y-Y
FIG. 9
SECTION X-X

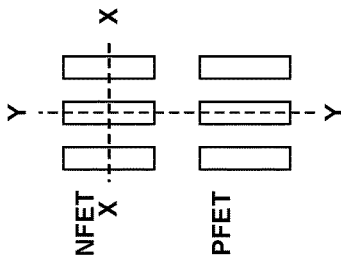
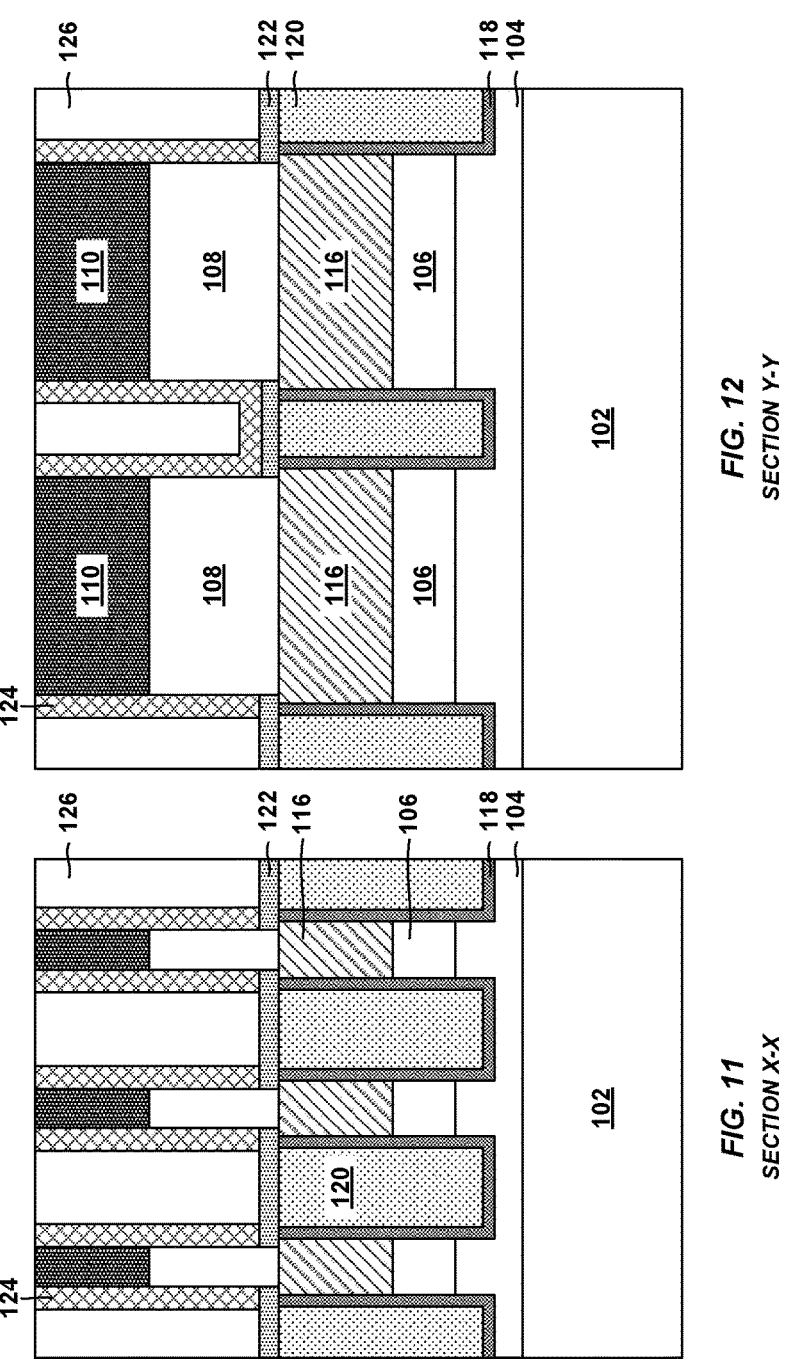

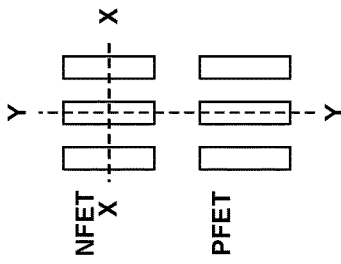
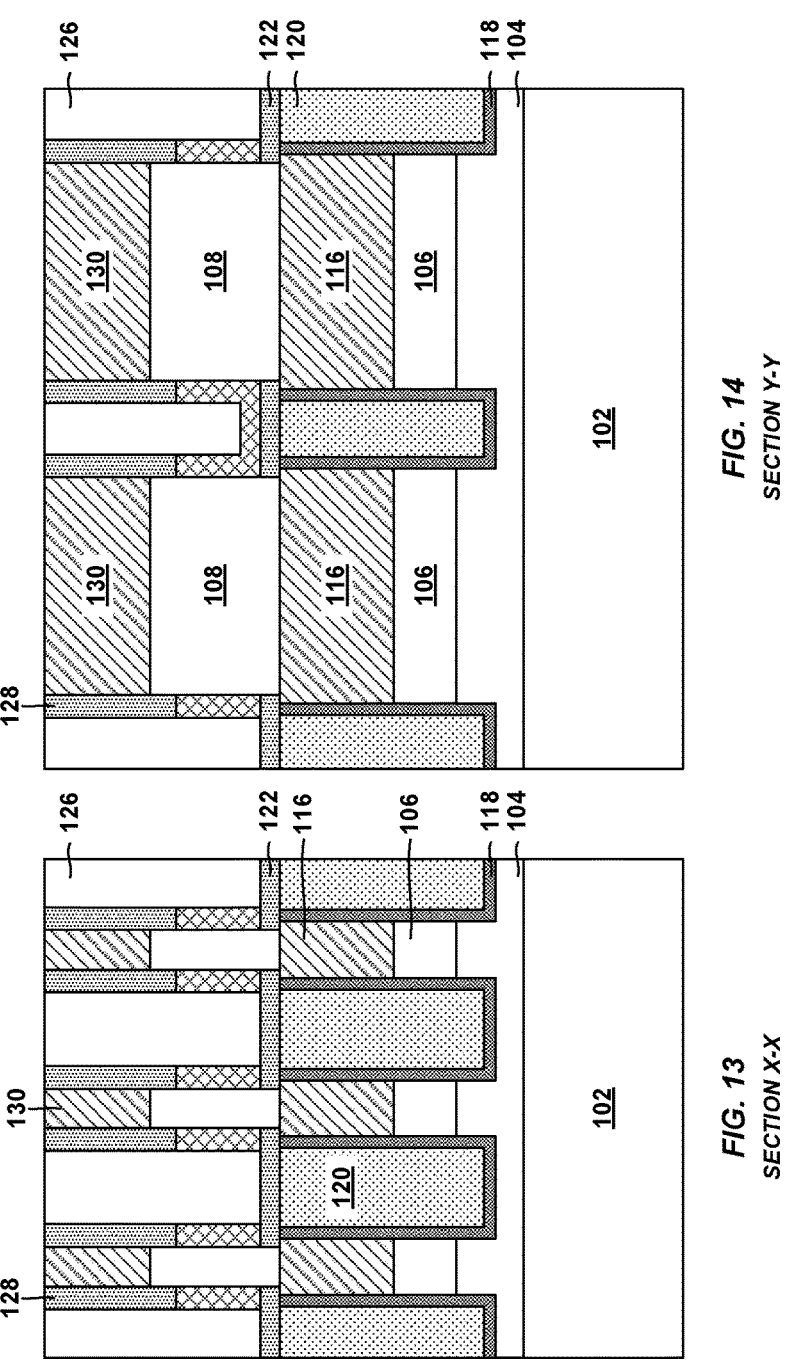
*FIG. 14*
SECTION Y-Y
*FIG. 13*
SECTION X-X
100

SECTION Y-Y

SECTION X-X 104
118
120

122

126

106

116

108

130

132

134

136

SECTION Y-Y 104
118

106

116
122

126

132

120

134

136

SECTION X-X

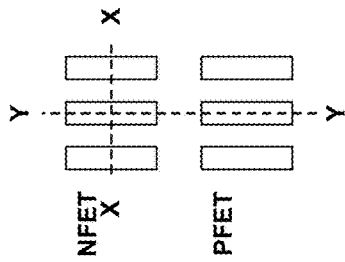
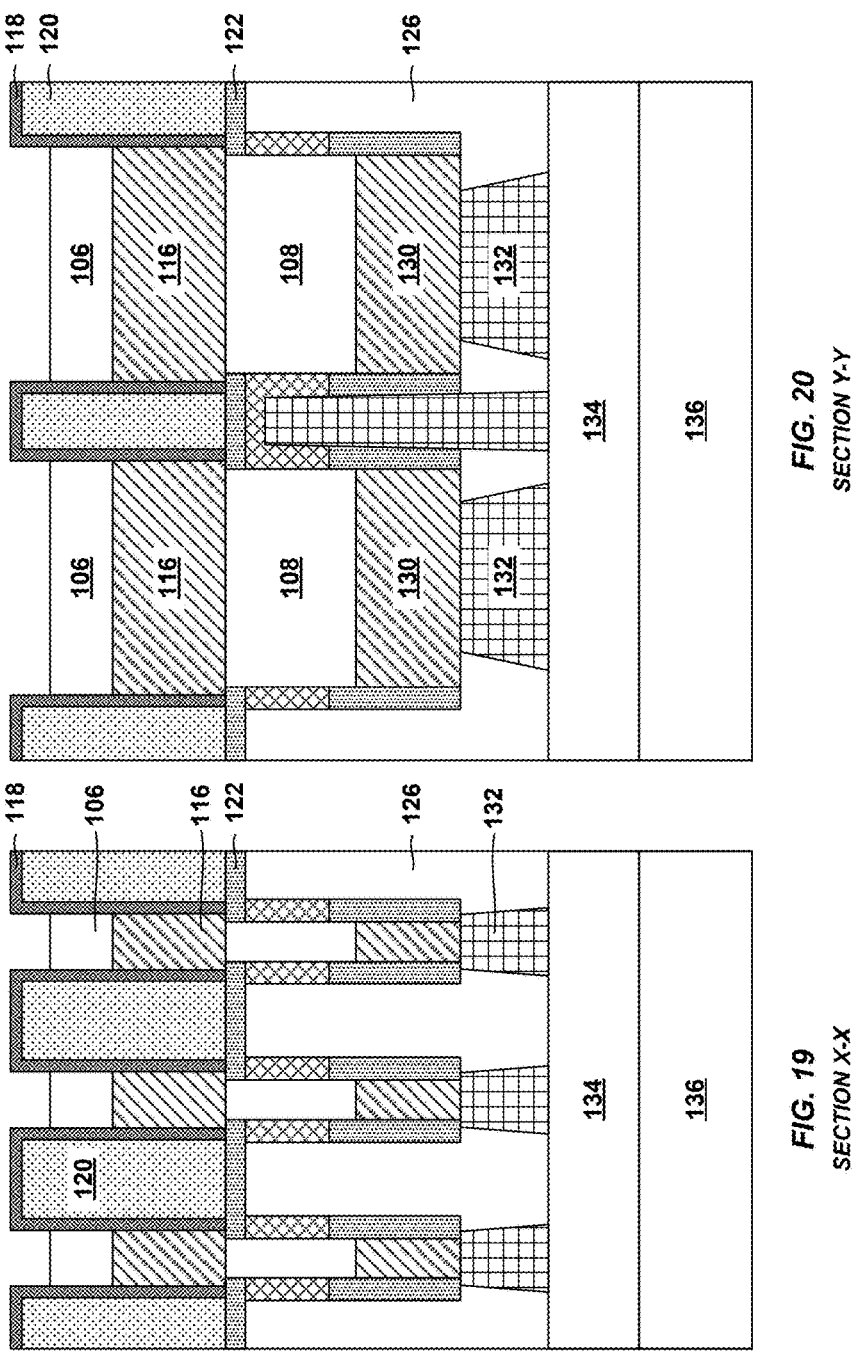
*FIG. 20*
SECTION Y-Y
*FIG. 19*
SECTION X-X

100

118
120
122
126
138
116
108
130
132
138
116
108
130
132
134
136

SECTION Y-Y 118
106
116
122
126
132
138
120
138
138
134
136

SECTION X-X

X
Y
Y
NFET
X
PFET

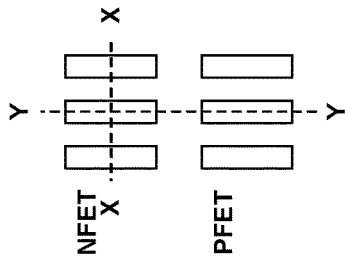
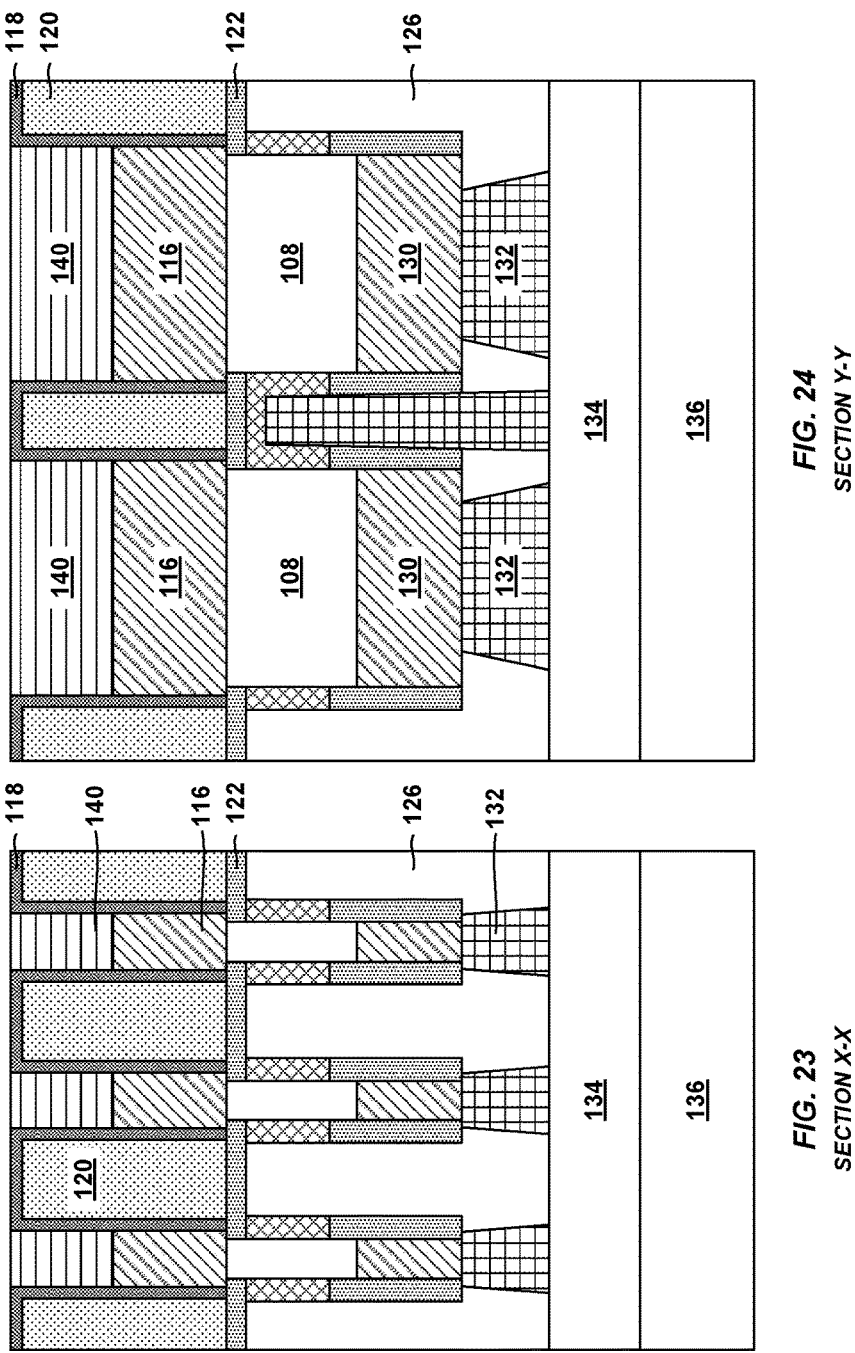
FIG. 24
SECTION Y-Y
FIG. 23
SECTION X-X

SECTION X-X

SECTION Y-Y

200

118
120
122
126
132

240
216
134
136

*SECTION X-X*

118
120
122
126

240    240
216    216
108    108
130    130
132    132
134
136

*SECTION Y-Y*

VERTICAL TRANSISTOR WITH SELF-ALIGN BACKSIDE CONTACT

BACKGROUND

The present invention generally relates to semiconductor structures, and more particularly to a self-aligned backside contact for a vertical transistor structure.

Vertical transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

SUMMARY

According to an embodiment of the present invention, a semiconductor structure is provided. The semiconductor structure may include a fin of a vertical transistor structure, a top source drain region on a top side of the fin, a bottom source drain region on a bottom side of the fin, and a backside contact below and contacting the bottom source drain region.

According to an embodiment of the present invention, the semiconductor structure further includes a shallow trench isolation liner, and a shallow trench isolation fill, where sidewalls of both the backside contact and the bottom source drain directly contact the shallow trench isolation liner.

According to an embodiment of the present invention, the semiconductor structure further includes a backside interconnect via in electrical contact with a bottom surface of the backside contact.

According to an embodiment of the present invention, the semiconductor structure further includes top spacers isolating the top source drain region from the fin, and bottom spacers isolating the bottom source drain region from the fin.

According to an embodiment of the present invention, a width of the bottom source drain region is equal to a width of the backside contact.

According to an embodiment of the present invention, a length of the bottom source drain region is equal to a length of the backside contact.

According to an embodiment of the present invention, the backside contact is self-aligned to adjacent shallow trench isolation liner.

According to an embodiment of the present invention, the bottom source drain region contacts bottom surfaces of one or more additional fins adjacent the fins.

According to another embodiment of the present invention, a semiconductor structure is provided. The semiconductor structure may include a fin of a vertical transistor structure, a top source drain region on a top side of the fin, a bottom source drain region on a bottom side of the fin, where a width of the bottom source drain region is larger than a length of the fin, and a backside contact below and contacting the bottom source drain region.

According to an embodiment of the present invention, the semiconductor structure further includes top spacers isolating the top source drain region from the fin, and bottom spacers isolating the bottom source drain region from the fin.

According to an embodiment of the present invention, a width of the bottom source drain region is equal to a width of the backside contact.

According to an embodiment of the present invention, a length of the bottom source drain region is equal to a length of the backside contact.

According to an embodiment of the present invention, the backside contact is self-aligned to adjacent shallow trench isolation liner.

According to another embodiment of the present invention, a semiconductor structure is provided. The semiconductor structure may include a fin of a vertical transistor structure, a top source drain region on a top side of the fin; a bottom source drain region on a bottom side of the fin, where a width of the bottom source drain region is larger than a width of the fin, and a backside contact below and contacting the bottom source drain region.

According to an embodiment of the present invention, the semiconductor structure further includes top spacers isolating the top source drain region from the fin, and bottom spacers isolating the bottom source drain region from the fin.

According to an embodiment of the present invention, a width of the bottom source drain region is equal to a width of the backside contact.

According to an embodiment of the present invention, a length of the bottom source drain region is equal to a length of the backside contact.

According to an embodiment of the present invention, the backside contact is self-aligned to adjacent shallow trench isolation liner.

According to another embodiment of the present invention, a semiconductor structure is provided. The semiconductor structure may include a fin of vertical transistor structure, a top source drain region on a top surface of the fin, where the entire top source drain region is above the fin, a bottom source drain region on a bottom side of the fin, where the entire bottom source drain region is below the fin, and a backside contact below and contacting the bottom source drain region, where the entire backside contact is below the bottom source drain region.

According to an embodiment of the present invention, a width of the bottom source drain region is equal to a width of the backside contact.

According to an embodiment of the present invention, a length of the bottom source drain region is equal to a length of the backside contact.

According to an embodiment of the present invention, the backside contact is self-aligned to adjacent shallow trench isolation liner.

According to an embodiment of the present invention, where a width of the bottom source drain region is larger than a width of the fin.

According to an embodiment of the present invention, the bottom source drain region contacts bottom surfaces of one or more additional fins adjacent the fins.

BRIEF DESCRIPTION OF THE DRAWINGS

The following detailed description, given by way of example and not intended to limit the invention solely thereto, will best be appreciated in conjunction with the accompanying drawings, in which:

FIGS. 1 and 2 are cross-sectional views of a semiconductor structure during an intermediate step of a method of fabricating a vertical transistor with a self-aligned backside contact for a vertical transistor according to an exemplary embodiment;

FIGS. 3 and 4 are cross-sectional views of the semiconductor structure after forming sidewall spacers and recessing the second substrate layer according to an exemplary embodiment;

FIGS. 5 and 6 are cross-sectional views of the semiconductor structure after forming bottom source drain regions according to an exemplary embodiment;

FIGS. 9 and 10 are cross-sectional views of the semiconductor structure after forming shallow trench isolation regions according to an exemplary embodiment;

FIGS. 11 and 12 are cross-sectional views of the semiconductor structure after forming bottom spacers, a metal gate, and an interlevel dielectric layer according to an exemplary embodiment;

FIGS. 13 and 14 are cross-sectional views of the semiconductor structure after forming top spacers top source drain regions according to an exemplary embodiment;

FIGS. 19 and 20 are cross-sectional views of the semiconductor structure after removing the etch stop layer according to an exemplary embodiment;

FIGS. 23 and 24 are cross-sectional views of the semiconductor structure after forming self-aligned backside contacts according to an exemplary embodiment;

Figures 7, 8:
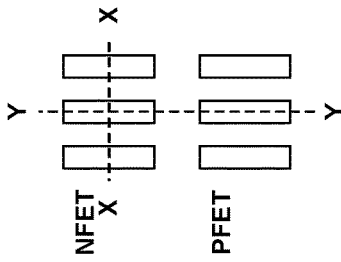
FIGS. 7 and 8 are cross-sectional views of the semiconductor structure after defining the active device regions using an RX patterning mask according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Vertical transport FETs (VTFET) have known advantages over conventional FinFETs in terms of density, performance, power consumption, and integration. However, valuable layout area is consumed by frontside contact structures to bottom source drain regions. Such contact structures are typically arranged adjacent to the primary cell and thus required additional layout area. Furthermore, current process techniques limit how much space can be saved by physically moving the bottom source drain contact structures closer to the primary cell.

The present invention generally relates to semiconductor structures, and more particularly to a self-aligned backside contact for a vertical transistor structure. More specifically, the self-aligned backside contact is formed from the backside and is vertically aligned with the fin of the primary cell. Doing so reduced "cell height", or otherwise reduces cell footprint or design area. Exemplary embodiments of a self-aligned backside contact for a vertical transistor structure are described in detail below by referring to the accompanying drawings in FIGS. 1 to 31. Those skilled in the art will readily appreciate that the detailed description given herein with respect to these figures is for explanatory purposes as the invention extends beyond these limited embodiments.

Referring now to FIGS. 1 and 2, a structure 100 is shown during an intermediate step of a method of fabricating a vertical transistor with a self-aligned backside contact according to an embodiment of the invention. FIG. 1 depicts a cross-sectional view of the structure 100 taken along line X-X perpendicular to fins. FIG. 2 depicts a cross-sectional view of the structure 100 taken along line Y-Y, parallel to fins. It is noted, FIGS. 1-16 and their corresponding descriptions are directed at frontside processing, while FIGS. 17-26 and their corresponding descriptions are directed at backside processing.

The structure 100 includes a first semiconductor substrate layer 102 (hereinafter "first substrate layer"), an etch stop layer 104, a second semiconductor substrate layer 106 (hereinafter "second substrate layer"), semiconductor fins 108, and masks 110.

The substrate layers 102, 106 may be formed from any appropriate material including, for example bulk semiconductor or a semiconductor-on-insulator layered structure. Illustrative examples of suitable materials for the substrate layers 102, 106 include, but are not limited to, silicon, silicon germanium, carbon doped silicon germanium, carbon doped silicon, epitaxial silicon, and multi-layers thereof. Although silicon is the predominantly used semiconductor material in wafer fabrication, alternative semiconductor materials can be employed, such as, but not limited to, gallium arsenide, indium phosphide, indium gallium arsenide, indium arsenide, gallium, cadmium telluride and zinc selenide.

In the present embodiment, the substrate layers 102, 106 are both bulk semiconductor substrate layers. By "bulk" it is meant that the substrate layers 102, 106 are entirely composed of at least one of the above materials listed above. In an embodiment, the substrate layers 102, 106 can be entirely composed of silicon. In other embodiments, the substrate layers 102, 106 may include a multilayered semiconductor material stack including at least two different semiconductor materials, as defined above. In another embodiment, the multilayered semiconductor material stack may include, in any order, a stack of silicon and a silicon germanium alloy. In another embodiment, the substrate layers 102, 106 may include a single crystalline semiconductor material. Such single crystal materials may have any of the well-known crystal orientations. For example, the crystal orientation of the substrate layers 102, 106 may be {100}, {110}, or {111}.

Other crystallographic orientations besides those specifically mentioned can also be used in the present application.

In an embodiment, the first substrate layer 102 can have a thickness ranging from approximately 50 um to approximately 1000 um; however, other thicknesses that are lesser than, or greater than, the aforementioned thickness range can also be employed. As will be described in more detail below, the first substrate layer 102 is sacrificial and will be entirely removed during subsequent processing. As such, the thickness of the first substrate layer 102 should be carefully selected to enable easy removal, but without compromising structural support as a carrier during fabrication.

Unlike the first substrate layer 102, the second substrate layer 106, or a portion thereof, remains an integral component of the final structure post fabrication. As such, the thickness of the second substrate layer 106 should be selected based on vertical transistor conventions. In an embodiment, the second substrate layer 106 can have a thickness in ranging from approximately 50 nm to approximately 300 nm; however, other thicknesses that are lesser than, or greater than, the aforementioned thickness range can also be employed.

The etch stop layer 104 is provided between the first substrate layer 102 and the second substrate layer 106, and may be formed from any appropriate material including, for example known buried oxide layers or silicon germanium. In all cases the substrate layers 102, 106 should be capable of being etched or removed selective to the etch stop layer 104, and vice versa.

The semiconductor fins 108 are etched from the second substrate layer 106, and form the channel region of the vertical transistor structure depicted by the structure 100. First, masks 110 are formed on, or above, the second substrate layer 106. The masks 110 define regions for the semiconductor fins 108. The second substrate layer 106 is etched or patterned using an anisotropic etch such as, for example, reactive ion etching, to remove material that is not covered by the masks 110 to form the semiconductor fins 108. Although the present application describes and illustrates forming three semiconductor fins 108, the same process may be used to form a single semiconductor fin, or more than two semiconductor fins.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each semiconductor fin 108 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each semiconductor fin 108 is spaced apart from its nearest neighboring semiconductor fin 108 by a pitch ranging from approximately 20 nm to approximately 100 nm; the pitch is measured from one point, or reference surface, of one semiconductor fin to the exact same point, or reference surface, on a neighboring semiconductor fin. Also, the semiconductor fins 108 are generally oriented parallel to each other.

Referring now to FIGS. 3 and 4, a structure 100 is shown after forming sidewall spacers 112 and recessing the second substrate layer 106 according to an embodiment of the invention. FIG. 3 depicts a cross-sectional view of the structure 100 taken along line X-X perpendicular to fins.

FIG. 4 depicts a cross-sectional view of the structure 100 taken along line Y-Y, parallel to fins.

The sidewall spacers 112 may be formed by conformally depositing or growing a dielectric, followed by an anisotropic etch that removes the dielectric from the horizontal surfaces of the structure 100. For example, the anisotropic etching is designed to substantially remove the conformal dielectric from top surfaces of the masks 110 and bottom surfaces of the openings between adjacent fins. After etching, the sidewall spacers 112 remain on the sidewalls of the semiconductor fins 108.

The sidewall spacers 112 may include any suitable dielectric material, such as, for example, a nitride or an oxide. In an embodiment, the sidewall spacers 112 may include silicon nitride. In another embodiment, the sidewall spacers 112 may have a horizontal width, or thickness, ranging from about 5 nm to about 10 nm. The sidewall spacers 112 may include a single layer; however, the sidewall spacers 112 may alternatively include multiple layers of dielectric material. In all cases, the sidewall spacers 112 should be made from a material composition with a thickness, suitable to protect sidewalls of the semiconductor fins 108 during subsequent fabrication techniques, as described in more detail below.

After forming the sidewall spacers 112, the second substrate layer 106 may be recessed using any suitable method, such as a wet etch, a dry etch, or a combination of sequential wet and/or dry etches. In an embodiment, the second substrate layer 106 is recessed using an anisotropic etch such as, for example, reactive ion etching. Alternatively, a wet etching technique may be used to recess the second substrate layer 106.

Etching is designed to recess exposed portions of the second substrate layer 106. Doing so, will create openings 114, or space, between and below the semiconductor fins 108 and the sidewall spacers 112, as illustrated. In all cases, etching stops before exposing the etch stop layer 104.

Referring now to FIGS. 5 and 6, a structure 100 is shown after forming bottom source drain regions 116 according to an embodiment of the invention. FIG. 5 depicts a cross-sectional view of the structure 100 taken along line X-X perpendicular to fins. FIG. 6 depicts a cross-sectional view of the structure 100 taken along line Y-Y, parallel to fins.

The bottom source drain regions 116 are formed by first epitaxially growing an epitaxy material on exposed surface of the second substrate layer 106 at a bottom of the openings 114. After which, the structure 100 may be annealed to diffuse the epitaxy material into the second substrate layer 106 according to known techniques. It is noted, sidewall spacers 112 function to prevent the epitaxy material from growing on surfaces of the semiconductor fins 108.

It should be understood that the bottom source drain regions 116 may be either one of a source region or a drain region, as appropriate. Illustrative examples of suitable materials for the bottom source drain regions 116 include, but are not limited to, silicon, silicon germanium, carbon doped silicon germanium, and multi-layers thereof.

In some embodiments, the bottom source drain regions 116 may be doped with dopant atoms as desired. The bottom source drain regions 116 may be in-situ doped as they are grown or subsequently doped using known techniques, such as, ion implant. The dopant atoms may be an n-type dopant or a p-type dopant. Exemplary n-type dopants include phosphorus, arsenic antimony for group IV semiconductors, and selenium, tellurium, silicon, and germanium for III-V semiconductors. Exemplary p-type dopants include beryllium, zinc, cadmium, silicon, germanium, for III-V semiconductors, and boron, aluminum, and gallium for group IV semiconductors. In an embodiment, for group IV semiconductors based device, the bottom source drain regions 116 are made from doped Si: (for n-type devices) or SiGe:B (for p-type devices), with dopant concentrations ranging from approximately $2 \times 10^{20}$ to approximately $2.5 \times 10^{21}$ atoms/cm$^2$, with a dopant concentration ranging from approximately $4 \times 10^{20}$ to approximately $1.5 \times 10^{21}$ atoms/cm$^2$ being more typical.

In another embodiment, the bottom source drain regions 116 may be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to alloys of gallium arsenide, indium arsenide, indium antimonide, indium phosphide, aluminum arsenide, indium gallium arsenide, indium aluminum arsenide, indium aluminum arsenide antimonide, indium aluminum arsenide phosphorude, indium gallium arsenide phosphorude and combinations thereof. In an embodiment, the bottom source drain regions 116 are made from doped III-V semiconductor materials with dopant concentrations ranging from approximately $1 \times 10^{18}$ to approximately $1 \times 10^{20}$ atoms/cm2, with a dopant concentration ranging from approximately $5 \times 10^{18}$ to approximately $8 \times 10^{19}$ atoms/cm2 being more typical.

Referring now to FIGS. 7 and 8, a structure 100 is shown after defining the active device regions using an RX patterning mask according to an embodiment of the invention. FIG. 7 depicts a cross-sectional view of the structure 100 taken along line X-X perpendicular to fins. FIG. 8 depicts a cross-sectional view of the structure 100 taken along line Y-Y, parallel to fins.

An RX patterning mask is applied, and active device regions are defined by etching exposed portions of the structure 100 according to known techniques. In doing so, portions of the bottom source drain regions 116 and the second substrate layer 106 are removed, as illustrated. According to embodiments of the present invention etching during RX patterning is selective to both the masks 110 and the sidewall spacers 112 and continues at least until the etch stop layer 104 is exposed. In most cases, etching will continue some nominal depth into the etch stop layer 104.

Referring now to FIGS. 9 and 10, a structure 100 is shown after forming shallow trench isolation regions (hereinafter "STI regions") according to an embodiment of the invention. FIG. 9 depicts a cross-sectional view of the structure 100 taken along line X-X perpendicular to fins. FIG. 10 depicts a cross-sectional view of the structure 100 taken along line Y-Y, parallel to fins.

According to embodiments of the present invention, the STI regions include an STI liner 118 and an STI fill 120. First, the STI liner 118 is conformally deposited directly on exposed surfaces of the structure 100 according to known techniques. Specifically, the STI liner 118 is conformally deposited directly on exposed surfaces of the etch stop layer 104, the second substrate layer 106, and the source drain regions 116, as illustrated. By "conformal" it is meant that a material layer has a continuous thickness. For example, a continuous thickness generally means a first thickness as measured from a bottom surface to a topmost surface that is the same as a second thickness as measured from an inner sidewall surface to an outer sidewall surface. The STI liner 118 may be formed from any appropriate dielectric including, for example, silicon nitride ($Si_xN_y$).

Next the STI fill 120 is blanket deposited across the entire structure 100, and specifically directly on top of the STI liner 118 according to known techniques. The STI fill 120 may be formed from any appropriate dielectric including, for example, silicon oxide ($SiO_x$).

Finally, the STI liner 118, the STI fill 120, and the sidewall spacers 112 are recessed, as illustrated. Recessing removes portions of the STI liner 118, the STI fill 120, and the sidewall spacers 112 selective to the masks 110 according to known techniques. After recessing the sidewall spacers 112 removed in their entirety and topmost surfaces of the STI liner 118 and the STI fill 120 are flush, or substantially flush, with topmost surfaces of the source drain regions 116.

In the present example, the STI regions penetrate, or extend from about a bottom of the semiconductor fins 108 to the etch stop layer 104 below the bottom source drain regions 116. Doing so ensures electrical isolation between adjacent active device regions, and enables backside contact formation.

Referring now to FIGS. 11 and 12, a structure 100 is shown after forming bottom spacers 122, a metal gate 124, and an interlevel dielectric layer 126 according to an embodiment of the invention. FIG. 11 depicts a cross-sectional view of the structure 100 taken along line X-X perpendicular to fins. FIG. 12 depicts a cross-sectional view of the structure 100 taken along line Y-Y, parallel to fins.

The bottom spacers 122 are deposited on a top surface of the bottom source drain regions 116 and the STI regions. It is specifically contemplated that the bottom spacers 122 are deposited in an anisotropic manner, without accumulation on the sidewalls of the semiconductor fins 108. This may be accomplished using, for example, gas cluster ion beam (GCIB) deposition, where the surface is bombarded by high-energy cluster ions. In alternative embodiments, other deposition techniques may be used to form the bottom spacers 122 only on the horizontal surfaces.

Alternatively, the bottom spacers 122 are formed by first depositing a blanket dielectric layer followed by a recess etch to remove a portion of the blanket dielectric layer. The recess etch removes a portion of the blanket dielectric layer until the bottom spacers 122 remains. In such cases, the chosen dielectric material is etched selective to the masks 110 and the semiconductor fins 108.

Suitable spacer materials from which the bottom spacers 122 are formed include, but are not limited to, oxides such as silicon oxide ($SiO_x$), nitrides such as silicon nitride ($Si_xN_y$), and/or low-K materials such as carbon-doped oxide materials containing silicon (Si), carbon (C), oxygen (O), and hydrogen (H) (SiCOH) or siliconborocarbonitride (SiBCN). The term "low-K" as used herein refers to a material having a relative dielectric constant κ which is lower than that of silicon dioxide.

With continued reference to FIGS. 11 and 12, a gate dielectric (not shown) is first conformally deposited directly on exposed surfaces of the structure 100 prior to forming the metal gate 124, according to known techniques. The gate dielectric is composed of a gate dielectric material. The gate dielectric can be an oxide, nitride, and/or oxynitride. In an example, the gate dielectric can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric can be formed and used as the gate dielectric.

Next, the metal gate 124 is conformally deposited directly on the gate dielectric according to known techniques. For example, the metal gate 124 can be formed by any deposition technique including, for example, chemical vapor deposition (CVD), plasma enhanced chemical vapor deposition (PECVD), physical vapor deposition (PVD), sputtering, or atomic layer deposition. In an embodiment, the metal gate 124 can have a thickness in a ranging from approximately 1 nm to approximately 10 nm. Other thicknesses that are lesser than, or greater than, the aforementioned thickness range can also be employed for the used in providing the metal gate 124. It is critical to monitor and control forming of the metal gate 124 to prevent pinch off between adjacent devices, especially, in narrow-pitch configurations. As illustrated, the bottom spacers 122 separate the bottom source drain regions 116 from the metal gate 124.

In an embodiment, the metal gate 124 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TiN, HfN, HfSi, or combinations thereof. The n-type work function metal can be formed using chemical vapor deposition atomic layer deposition, sputtering or plating.

In another embodiment, the metal gate 124 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof. In an embodiment, the p-type work function metal can be formed by, a physical vapor deposition method, such as sputtering, chemical vapor deposition or atomic layer deposition.

Next, portions of the gate dielectric and the metal gate 124 are removed according to known techniques. Specifically, an anisotropic etch may be used to remove portions of the gate dielectric and the metal gate 124 from the horizontal surfaces of the structure 100. For example, the anisotropic etching is designed to substantially remove portions of the gate dielectric and the metal gate 124 from top surfaces of the masks 110 and the bottom spacers 122 in unmasked areas, as illustrated. In the case of the present embodiment, the gate dielectric and the metal gate 124 are not removed from between ends of the fins 108 as shown in FIG. 12.

Finally, according to embodiments of the present invention, the interlevel dielectric layer 126 is blanket deposited across the structure 100 according to known techniques. The interlevel dielectric layer 126 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide.

In an embodiment, the interlevel dielectric layer 126 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

After deposition, a planarization technique such as, for example, chemical mechanical planarization (CMP) and/or grinding is applied. The planarization technique removes excess material of the interlevel dielectric layer 126 and continues polishing until uppermost surfaces of the masks 110 and the metal gate 124 are exposed. After polishing the uppermost surfaces of the masks 110 and the metal gate 124 are flush, or substantially flush, with an uppermost surface of the interlevel dielectric layer 126.

Referring now to FIGS. 13 and 14, a structure 100 is shown after forming top spacers 128 top source drain regions 130 according to an embodiment of the invention. FIG. 13 depicts a cross-sectional view of the structure 100 taken along line X-X perpendicular to fins. FIG. 14 depicts a cross-sectional view of the structure 100 taken along line Y-Y, parallel to fins.

First, the metal gate 124 is recessed according to known techniques. More specifically, the metal gate 124 and the gate dielectric are recessed selective to interlevel dielectric layer 126 and the masks 110 until upper portions of the fins 108 are exposed.

The metal gate 124 and the gate dielectric can be recessed using any suitable method, such as a wet etch, a dry etch, or a combination of sequential wet and/or dry etches. In an embodiment, the metal gate 124 and the gate dielectric could be recessed using an anisotropic etch such as, for example, reactive ion etching. Alternatively, a wet etching technique may be used to recess the metal gate 124 and the gate dielectric.

Etching will would remove top portions of the metal gate 124 and the gate dielectric, and create an opening, or space, between the semiconductor fins 108 and the interlevel dielectric layer 126. After etching, upper surfaces of the metal gate 124 and the gate dielectric will be below an uppermost surface of the semiconductor fins 108.

It is critical that the metal gate 124 and the gate dielectric are recessed below the uppermost of the semiconductor fins 108 to ensure isolation between gate metal and the top source drain region 130. If the metal gate 124 and the gate dielectric are not recessed below the uppermost surface of the semiconductor fins 108, a later formed source drain epitaxy may contact the metal gate 124 and create a short. As such, controlling the recess depth of the metal gate 124 and the gate dielectric below the tops of the semiconductor fins 108 will allow for accurate top junction definition as well as define the channel length.

The top spacers 128 may be formed in directly on top of upper surfaces of the metal gate 124 and the gate dielectric exposed after recessing. The top spacers 128 may be formed using a deposition technique followed by a spacer etch (anisotropic etch). For example, techniques for depositing the top spacers 128 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for etching the top spacers 128 include dry etching techniques, such as, for example, reactive ion etching, ion beam etching, plasma etching or laser ablation. The top spacers 128 are composed of any dielectric material that is similar, in terms of composition and etch rate, to the bottom spacers 122 described above.

Next, the masks 110 are selectively removed according to known techniques. The masks 110 are removed using an etch selective to the top source drain regions 130 and the semiconductor fins 108. In an embodiment, when the masks 110 are composed of silicon nitride ($Si_xN_y$), a hot (around 150° C. to 180° C.) phosphoric acid solution may be used to remove the masks 110 selective to the top source drain regions 130 and the semiconductor fins 108. Removing the masks 110 creates an opening and exposes uppermost surfaces of the semiconductor fins 108.

After the masks 110 are removed, an optional ion implant technique and thermal process are performed to form a junction. If employed, the semiconductor fins 108 are doped with dopant atoms using an implantation technique in a similar fashion as described above with respect to forming the bottom source drain regions 116. Like above, the dopant atoms may be an n-type dopant or a p-type dopant. Exemplary n-type dopants include phosphorus, arsenic antimony, selenium, tellurium, silicon, and germanium. Exemplary p-type dopants include beryllium, zinc, cadmium, silicon, germanium, boron, aluminum, and gallium. Typically, both the bottom source drain regions 116 and the junction will be doped with the same type dopants.

Second, a thermal process is used to diffuse the implanted dopants into the semiconductor fin 108, or top of the channel, to form the junction. In some cases, dopants from the top source drain regions 130 may also diffuse into the semiconductor fin 108 and contribute to formation of the junction. In at least one embodiment, the thermal process may include a high temperature spike anneal, or a laser spike anneal.

Next, the top source drain regions 130 are formed in the opening between adjacent top spacers 128. As such, the top source drain regions 130 directly contact exposed uppermost surfaces of the semiconductor fins 108, the top spacers 128 separate and isolate the top source drain regions 130 from the metal gate 124.

The top source drain regions 130 can be epitaxially grown from exposed surfaces the semiconductor fins 108 using conventional techniques similar to the bottom source drain regions 116. Additionally, the top source drain regions 130 can be formed from similar materials and similar dopant concentrations as bottom source drain regions 116. In the present embodiment, the top source drain regions 130 should be grown to completely fill the opening. In some case, the process may include overgrowing the top source drain regions 130 above a top surface of the interlevel dielectric layer 126, after which any excess material will be removed by a subsequent chemical mechanical planarization technique. At this stage of fabrication, the top source drain regions 130 do not undergo a high temperature anneal in order to preserve the integrity of the metal gate 124.

Figures 15, 16:
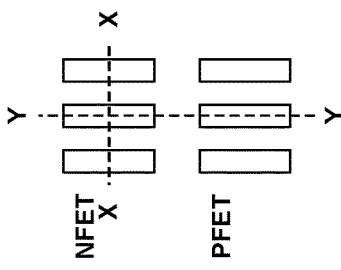
FIGS. 15 and 16 are cross-sectional views of the semiconductor structure after forming contact structures in middle-of-line, forming back-end-of-line, and securing a carrier wafer according to an exemplary embodiment.

Referring now to FIGS. 15 and 16, a structure 100 is shown after forming contact structures 132 in middle-of-line, forming back-end-of-line 134, and securing a carrier wafer 136 according to an embodiment of the invention. FIG. 15 depicts a cross-sectional view of the structure 100 taken along line X-X perpendicular to fins. FIG. 16 depicts a cross-sectional view of the structure 100 taken along line Y-Y, parallel to fins.

First, the contact structure 132 are formed in the middle-of-line according to known techniques. For example, an additional layer of interlevel dielectric material, shown as part of interlevel dielectric layer 126, is deposited and the contact structures 132 are formed in the interlevel dielectric layer 126 using conventional damascene techniques. The contact structures 132 may include typical source drain contacts and gate contacts. For example, the contact structures 132 may include source drain contact and gate contacts formed in an additional layer of interlevel dielectric material, as illustrated.

The contact structures 132 may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the contact structures 132.

In a typical fashion, a planarization technique such as, for example, chemical mechanical planarization (CMP) and/or grinding is applied after depositing the contact structures 132. The planarization technique removes excess conductive material of the contact structures 132 from above the inter-level dielectric layer 126. After polishing, uppermost surfaces of the contact structures 132 are flush, or substantially flush, with upper surface of the interlevel dielectric layer 126. After forming the middle-of-line, including the contact structures 132, the back-end-of-line 134 is formed on top of the middle-of-line according to known techniques.

Finally, the carrier wafer 136 is attached, or removably secured, to the back-end-of-line 134. In general, and not depicted, the carrier wafer 136 may be thicker than the other layers. Temporarily bonding the structure 100 to a thicker carrier provides improved handling and additional support for backside processing of thin wafers. After backside processing described below, the structure may be de-bonded, or removed, from the carrier wafer 134 according to known techniques.

Figures 17, 18:
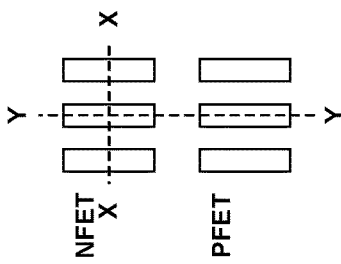
FIGS. 17 and 18 are cross-sectional views of the semiconductor structure after flipping the assembly and removing the substrate according to an exemplary embodiment.

Referring now to FIGS. 17 and 18, a structure 100 is shown after flipping the assembly and removing the first substrate layer 102 according to an embodiment of the invention. FIG. 17 depicts a cross-sectional view of the structure 100 taken along line X-X perpendicular to fins. FIG. 18 depicts a cross-sectional view of the structure 100 taken along line Y-Y, parallel to fins.

First, the structure 100 is flipped 180 degrees to prepare for backside processing. In general, backside processing includes fabrication or processing of the structure 100 opposite the active device and wiring layers. Next, the first substrate layer 102 is removed selective to the etch stop layer 104 according to known techniques.

Referring now to FIGS. 19 and 20, a structure 100 is shown after removing the etch stop layer 104 according to an embodiment of the invention. FIG. 19 depicts a cross-sectional view of the structure 100 taken along line X-X perpendicular to fins. FIG. 20 depicts a cross-sectional view of the structure 100 taken along line Y-Y, parallel to fins.

The etch stop layer 104 is selectively removed according to known techniques. For example, a wet etching technique can be used to remove the etch stop layer 104 selective to the second substrate layer 106 and the STI regions, specifically the STI liner 118, as illustrated.

Figures 21, 22:
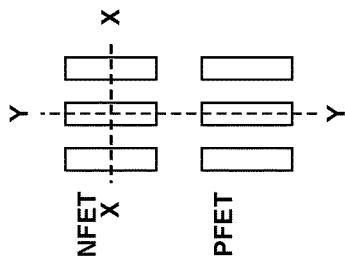
FIGS. 21 and 22 are cross-sectional views of the semiconductor structure after removing remaining portions of the second substrate layer according to an exemplary embodiment.

Referring now to FIGS. 21 and 22, a structure 100 is shown after removing remaining portions of the second substrate layer 106 according to an embodiment of the invention. FIG. 21 depicts a cross-sectional view of the structure 100 taken along line X-X perpendicular to fins. FIG. 22 depicts a cross-sectional view of the structure 100 taken along line Y-Y, parallel to fins.

The second substrate layer 106 is selectively removed according to known techniques. For example, a wet etching technique can be used to remove the second substrate layer 106 selective to the bottom source drain regions 116, as illustrated. After removal, trenches 138 remain.

Referring now to FIGS. 23 and 24, a structure 100 is shown after forming self-aligned backside contacts 140 according to an embodiment of the invention. FIG. 23 depicts a cross-sectional view of the structure 100 taken along line X-X perpendicular to fins. FIG. 24 depicts a cross-sectional view of the structure 100 taken along line Y-Y, parallel to fins.

The backside contacts 140 are formed in the trenches 138. Specifically, the trenches 138 are filled with a conductive material to form the backside contacts 140. As such, in at least one embodiment, the conductive material of the backside contacts 140 is deposited directly on exposed upper surfaces of the STI liner 118 and the bottom source drain regions 116, as illustrated. Furthermore, it is noted that the backside contacts 140 are self-aligned and may alternatively be referred to as self-aligned backside contacts. Most notably, the backside contacts 140 fully cover entire source drain epitaxy (116), without the risk of contact-to-contact shorting. This is achieved by the existence of the STI regions, including the STI liner 118, the STI fill 120. As previously described, the STI regions are initially created deeper than the thickness of the second substrate layer 106 and into the etch stop layer 104 specifically to accommodate forming of the backside contacts 140, as illustrated.

The backside contacts 140 may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the backside contacts 140.

After deposition, a planarization technique such as, for example, chemical mechanical planarization (CMP) and/or grinding is applied. The planarization technique removes excess conductive material of the backside contacts 140 from above the STI liner 118. After polishing, upper surfaces of the backside contacts 140 are flush, or substantially flush, with upper surface of the STI liner 118.

Figures 25, 26:
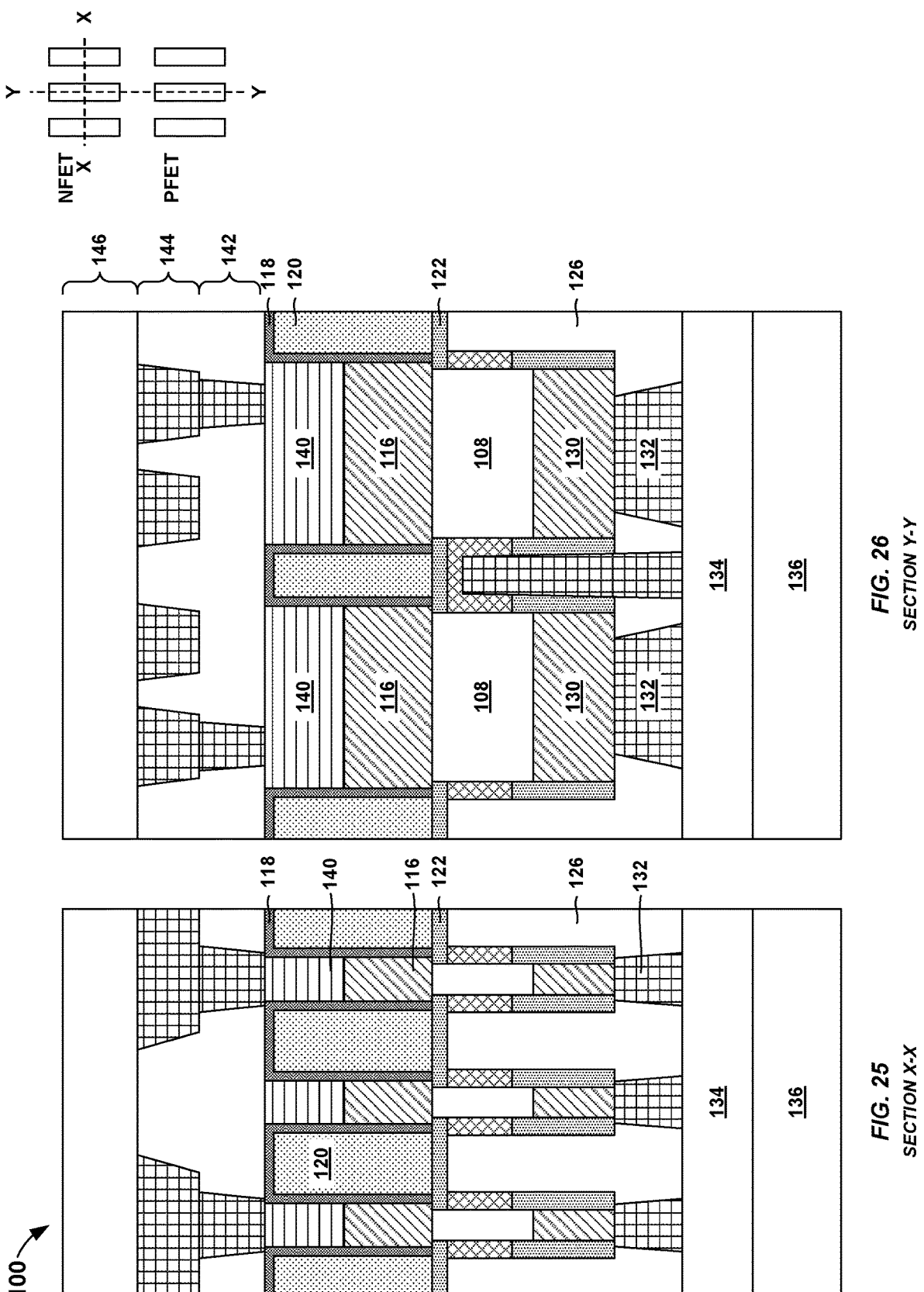
FIGS. 25 and 26 are cross-sectional views of the semiconductor structure after forming backside vias, backside metal lines, and a backside wiring interconnect level according to an exemplary embodiment.

Referring now to FIGS. 25 and 26, a structure 100 is shown after forming backside vias 142, backside metal lines 144, and a backside wiring interconnect level 146 according to an embodiment of the invention. FIG. 25 depicts a cross-sectional view of the structure 100 taken along line X-X perpendicular to fins. FIG. 26 depicts a cross-sectional view of the structure 100 taken along line Y-Y, parallel to fins. The backside vias 142, the backside metal lines 144, and the backside wiring interconnect level 146 are formed in backside dielectric layers according to known techniques.

As illustrated in FIGS. 25 and 26, the vertical transistor structure represented by the structure 100 in this example has some distinctive notable features. For instance, the structure 100 includes a self-aligned backside contact (140). Conventional contact structures for bottom source drain regions of a vertical transistor device are fabricated on or from the front side are arrange adjacent to the primary cell, and require additional space. Unlike conventional contact structures, backside contacts (140) disclose herein are aligned vertically with, and stacked directly beneath, the bottom source drain region. Doing so eliminates the need for the extra space, thereby reducing the device's "cell height" or footprint.

Similar to conventional vertical transistor structures the bottom spacers 122 isolate the bottom source drain region 116 from the fin 108, and the top spacers 128 isolate the top source drain region 130 from the fin 108. In the present embodiment, the bottom spacers 122 are substantially horizontal and extend between adjacent fins 108, and the top spacers 128 are substantially vertical and surround the top source drain region 130.

With continued reference to FIGS. 25 and 26, it is noted a width (in the x-direction) of the bottom source drain region 116 is equal to a width of the backside contact 140, and a length (in the y-direction) of the bottom source drain region 116 is equal to a length of the backside contact 140. Furthermore, a width (in the x-direction) of the bottom source drain region 116 is larger than a width of the fin 108.

Figures 27, 28:
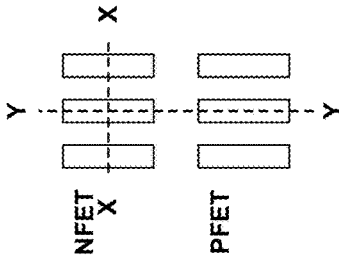
FIGS. 27 and 28 are cross-sectional views of a semiconductor structure during an intermediate step of a method of fabricating a vertical transistor with a self-aligned backside contact for a vertical transistor according to an alternate embodiment.

Referring now to FIGS. 27 and 28, a structure 200 is shown according to an alternative embodiment of the invention. FIG. 27 depicts a cross-sectional view of the structure 100 taken along line X-X perpendicular to fins. FIG. 28 depicts a cross-sectional view of the structure 100 taken along line Y-Y, parallel to fins. The structure 200 is substantially similar to the structure 100 described above except it benefits from a shared bottom source drain regions 216 and a shared backside contacts 240. Unlike the structure 100, the shared bottom source drain regions 216 and the shared backside contacts 240 of the structure 200 contact fins 108 of multiple adjacent vertical devices, as illustrated.

Like the structure 100, a length (in the y-direction) of the shared bottom source drain region 216 is equal to a length of the shared backside contact 240. Also, like the structure 100, a width (in the x-direction) of the shared bottom source drain region 216 is larger than a width of the fin 108. Unlike the structure 100, a width (in the x-direction) of the shared bottom source drain region 216 is larger than a cumulative width of multiple fins 108. As such the shared bottom source drain region 216 contacts bottom surfaces of multiple fins 108.

Figures 29, 30, 31:
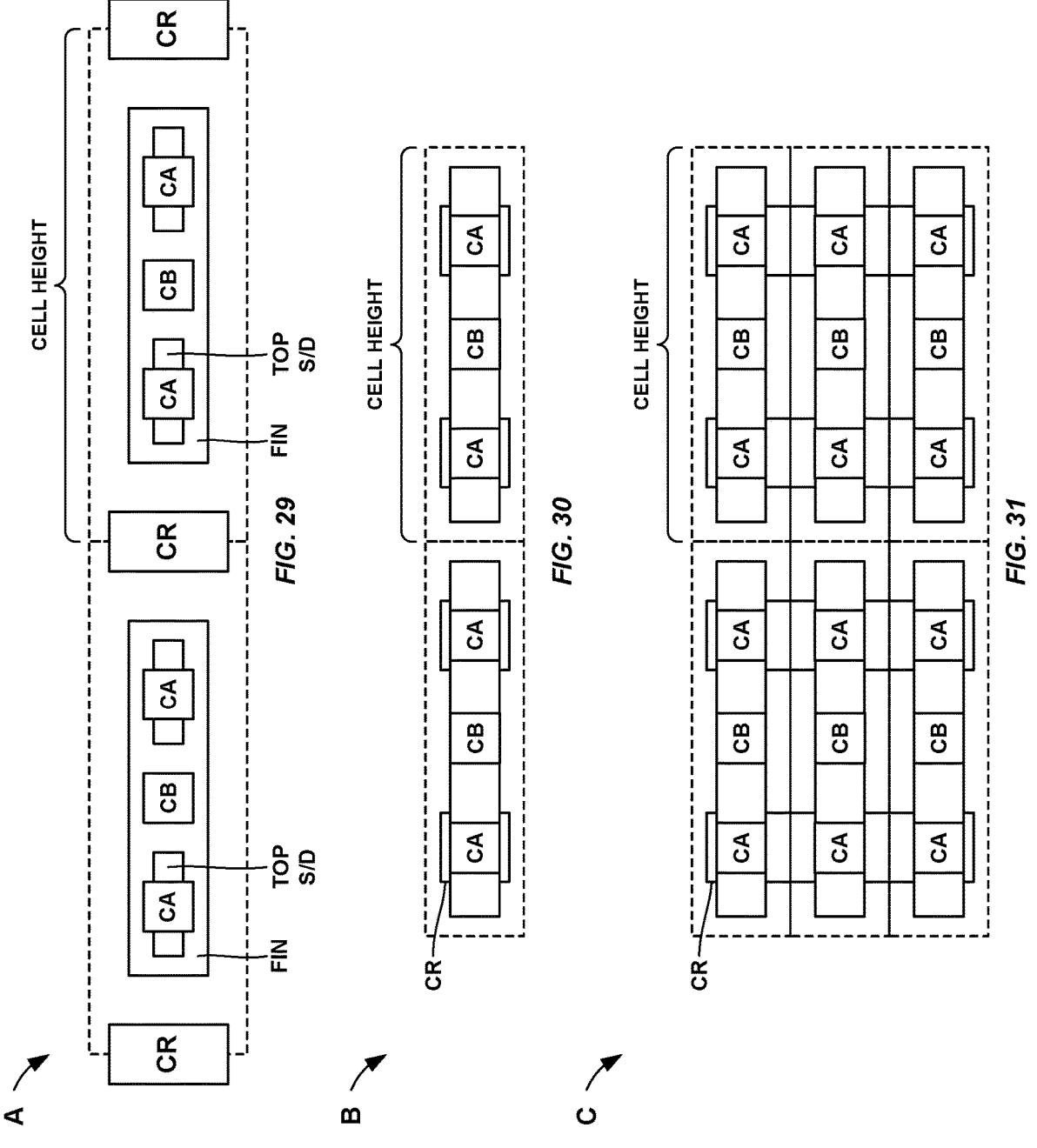
FIGS. 29, 30, and 31 depict multiple design layouts according to exemplary embodiments.

Referring now to FIGS. 29, 30, and 31, multiple design layouts are depicted according to embodiments of the invention. FIG. 29 depicts design layout A representative of a typical configuration. FIG. 30 depicts design layout B corresponding to the structure 100 described above. FIG. 31 depicts design layout C corresponding to the structure 200 described above.

Design layout A illustrates relative position the fins, the gate contacts (CB), the top source drain contacts (CA), and the bottom source drain contacts (CR) are shown in each of the design layouts depicted. Additionally, a representative "cell height" is depicted for each. Of most relevance, the bottom source drain contacts (CR) are typically positioned adjacent or next to the primary cell or fin. In the illustrated example, the bottom source drain contacts (CR) are arranged at opposite ends of the fin. In some cases, the bottom source drain contacts (CR) separate one end of a first fin from one end of a second fin, as depicted. Such configurations have a relatively large cell height, where the cell height is generally a measurement parallel with the fin from one end of the transistor device to the other end of the transistor device. In the present example, the cell height of a single vertical device is measured form one bottom source drain contacts (CR) to another.

In contrast, and in accordance with embodiments of the present invention, the cell height of the vertical transistor device of design layout B is less than the cell height of the vertical transistor device of design layout A. As previously discussed, embodiments of the present invention enable fabrication of a vertical transistor device with a reduced cell height. Doing so conserves valuable layout area.

Like design layout B, design layout C also benefits from a reduced cell height, but illustrates an alternative configuration in which the bottom source drain contacts (CR) are merged across adjacent fins or cells. Such a configuration may, or may not have a shared source drain region, like the structure 200.

It should be noted that since both the top source drain region and the bottom source drain region are vertically aligned with, and between, the top source drain contacts (CA), and the bottom source drain contacts (CR), they are otherwise omitted from design layout B and design layout C.

Furthermore, according to embodiments of the present application, the bottom source drain contact (CR) can be relatively larger than the top source drain contacts (CA) in design layout B and design layout C, as previously discussed with respect to the structure 100 and the structure 200. More specifically, the size difference between the bottom source drain contact (CR) and the top source drain contacts (CA) is directly proportional to a thickness of the sidewall spacers 112 (See FIGS. 7-10).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
a fin of a vertical transistor structure;
a top source drain region on a top side of the fin;
top spacers isolating the top source drain region from a gate;
a bottom source drain region on a bottom side of the fin;
bottom spacers isolating the bottom source drain region from the gate;
a backside contact below and contacting the bottom source drain region; and
a shallow trench isolation region, wherein a bottom surface of the backside contact is substantially flush with a bottom most surface of the shallow trench isolation region.

2. The semiconductor structure according to claim 1, wherein the shallow trench isolation region further comprises:
a shallow trench isolation liner; and a shallow trench isolation fill, wherein sidewalls of both the backside contact and the bottom source drain region directly contact the shallow trench isolation liner.

3. The semiconductor structure according to claim 1, further comprising:

a backside interconnect via in electrical contact with a bottom surface of the backside contact.

4. The semiconductor structure according to claim 1, wherein a width of the bottom source drain region is equal to a width of the backside contact.

5. The semiconductor structure according to claim 1, wherein a length of the bottom source drain region is equal to a length of the backside contact, wherein a width of the bottom source drain region is equal to a width of the backside contact, wherein the length of the bottom source drain region is perpendicular to the width of the bottom source drain region, and wherein the length of the backside contact is perpendicular to the width of the backside contact.

6. The semiconductor structure according to claim 1, wherein the backside contact is self-aligned to the shallow trench isolation region.

7. The semiconductor structure according to claim 1, wherein the bottom source drain region contacts bottom surfaces of one or more additional fins adjacent the fin.

8. A semiconductor structure comprising:

a fin of a vertical transistor structure;

a top source drain region on a top side of the fin;

a bottom source drain region on a bottom side of the fin, wherein a width of the bottom source drain region is larger than a length of the fin, wherein the width of the bottom source drain region is perpendicular to the length of the fin;

a backside contact below and contacting the bottom source drain region; and a shallow trench isolation region, wherein a bottom surface of the backside contact is substantially flush with a bottom most surface of the shallow trench isolation region.

9. The semiconductor structure according to claim 8 further comprising:

top spacers isolating the top source drain region from a gate; and bottom spacers isolating the bottom source drain region from the gate.

10. The semiconductor structure according to claim 8, wherein a width of the bottom source drain region is equal to a width of the backside contact.

11. The semiconductor structure according to claim 8, wherein a length of the bottom source drain region is equal to a length of the backside contact, wherein a width of the bottom source drain region is equal to a width of the backside contact, wherein the length of the bottom source drain region is perpendicular to the width of the bottom source drain region, and wherein the length of the backside contact is perpendicular to the width of the backside contact.

12. The semiconductor structure according to claim 8, wherein the backside contact is self-aligned to the shallow trench isolation region.

13. A semiconductor structure comprising:

a fin of a vertical transistor structure;

a top source drain region on a top side of the fin;

a bottom source drain region on a bottom side of the fin, wherein a width of the bottom source drain region is larger than a width of the fin;

a backside contact below and contacting the bottom source drain region, wherein a length of the bottom source drain region is equal to a length of the backside contact, wherein a width of the bottom source drain region is equal to a width of the backside contact; and a shallow trench isolation region, wherein a bottom surface of the backside contact is substantially flush with a bottom most surface of the shallow trench isolation region.

14. The semiconductor structure according to claim 13, further comprising:

top spacers isolating the top source drain region from a gate; and bottom spacers isolating the bottom source drain region from the gate.

15. The semiconductor structure according to claim 13, wherein a width of the bottom source drain region is equal to a width of the backside contact.

16. The semiconductor structure according to claim 13, wherein the length of the bottom source drain region is perpendicular to the width of the bottom source drain region, and wherein the length of the backside contact is perpendicular to the width of the backside contact.

17. The semiconductor structure according to claim 13, wherein the backside contact is self-aligned to the shallow trench isolation region.

18. A semiconductor structure comprising:

a fin of a vertical transistor structure;

a top source drain region on a top surface of the fin;

a bottom source drain region on a bottom side of the fin, wherein the bottom source drain region contacts bottom surfaces of one or more additional fins adjacent the fin;

a backside contact below and contacting the bottom source drain region; and a shallow trench isolation region, wherein a bottom surface of the backside contact is substantially flush with a bottom most surface of the shallow trench isolation region.

19. The semiconductor structure according to claim 18, further comprising:

top spacers isolating the top source drain region from a gate; and bottom spacers isolating the bottom source drain region from the gate.

20. The semiconductor structure according to claim 18, wherein a width of the bottom source drain region is equal to a width of the backside contact.

21. The semiconductor structure according to claim 18, wherein a length of the bottom source drain region is equal to a length of the backside contact, wherein a width of the bottom source drain region is equal to a width of the backside contact, wherein the length of the bottom source drain region is perpendicular to the width of the bottom source drain region, and wherein the length of the backside contact is perpendicular to the width of the backside contact.

22. The semiconductor structure according to claim 18, wherein the backside contact is self-aligned to the shallow trench isolation region.

23. The semiconductor structure according to claim 18, wherein a width of the bottom source drain region is larger than a width of the fin.

* * * * *